(12) United States Patent
Sakai

(10) Patent No.: US 8,115,108 B2
(45) Date of Patent: Feb. 14, 2012

(54) FLEXIBLE PRINTED CIRCUIT BOARD AND MANUFACTURING METHOD FOR THE SAME

(75) Inventor: Nobuyuki Sakai, Tokyo (JP)

(73) Assignee: Nippon Mektron, Ltd., Tokyo (JP)

( * ) Notice: Subject to any disclaimer, the term of this patent is extended or adjusted under 35 U.S.C. 154(b) by 616 days.

(21) Appl. No.: 12/291,892

(22) Filed: Nov. 14, 2008

(65) Prior Publication Data

US 2009/0218117 A1 Sep. 3, 2009

(30) Foreign Application Priority Data

Mar. 3, 2008 (JP) ................................. 2008-052712

(51) Int. Cl.
*H05K 1/11* (2006.01)
(52) U.S. Cl. ........ 174/261; 174/265; 361/749; 361/799; 29/845; 29/847
(58) Field of Classification Search .......... 174/261–266, 174/255, 257, 259, 250, 254; 361/796, 749–753, 361/780, 790, 794, 799, 800, 816, 777; 29/844–847, 29/852, 842, 829, 33.5; 439/877
See application file for complete search history.

(56) References Cited

U.S. PATENT DOCUMENTS

| | | | | |
|---|---|---|---|---|
| 4,964,947 A | * | 10/1990 | Yarita et al. ........................ | 216/18 |
| 6,308,406 B1 | * | 10/2001 | Gill et al. ......................... | 29/849 |
| 6,601,297 B1 | * | 8/2003 | Schmidt ............................ | 29/852 |
| 6,954,986 B2 | * | 10/2005 | Schmidt ............................ | 29/852 |
| 2004/0111882 A1 | * | 6/2004 | Nakamura et al. ................ | 29/846 |
| 2004/0112632 A1 | * | 6/2004 | Michiwaki et al. ............... | 174/254 |
| 2007/0295534 A1 | * | 12/2007 | Ishii et al. ........................ | 174/261 |

FOREIGN PATENT DOCUMENTS

| | | |
|---|---|---|
| JP | 05-243756 | 9/1993 |
| JP | 08-125380 | 5/1996 |
| JP | 2005-191076 | 7/2005 |
| JP | 2005-317946 | 11/2005 |

* cited by examiner

*Primary Examiner* — Hoa C Nguyen
(74) *Attorney, Agent, or Firm* — Fattibene and Fattibene; Paul A. Fattibene

(57) ABSTRACT

The insulation base side of single-sided FPC is turned to the die side, and the mounting surface side of ground circuit is turned to the upper side, and the FPC is placed on die (a). When the portion of ground circuit where the conduction is realized and metal reinforcing plate are punched by punch of which the clearance dimension is made to be 50 to 95% of the thickness of the material to be punched, hole sagging will be formed (b). The insulation base 1 side is turned up, electrically conductive adhesive and metal reinforcing plate are laminated in this order, heating pressing is performed with the press apparatus for metal reinforcing plate to be laminated (c). Thereby, laminated FPC is formed (d). At this time, since electrically conductive adhesive is injected into hole sagging by press pressing, the electrical connection of metal reinforcing plate and ground circuit can be attained by the interlaminar conduction by means of electrically conductive adhesive, and there is also no residual air.

8 Claims, 4 Drawing Sheets

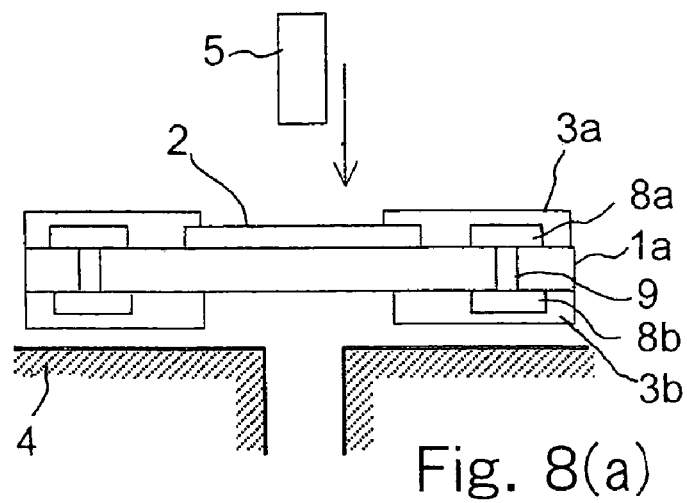
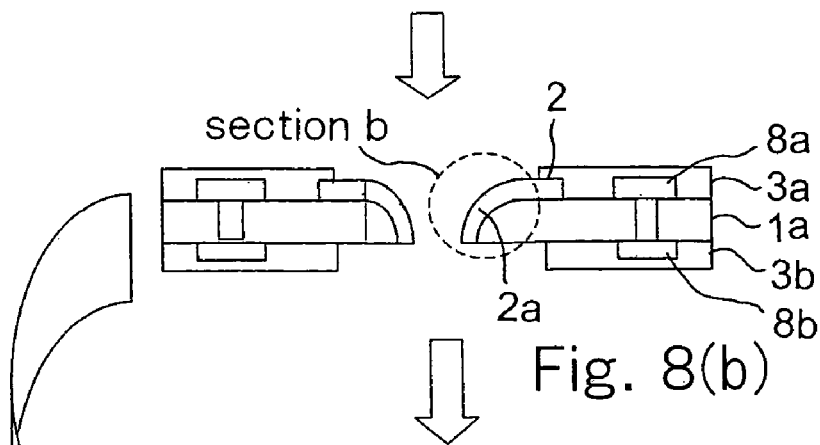
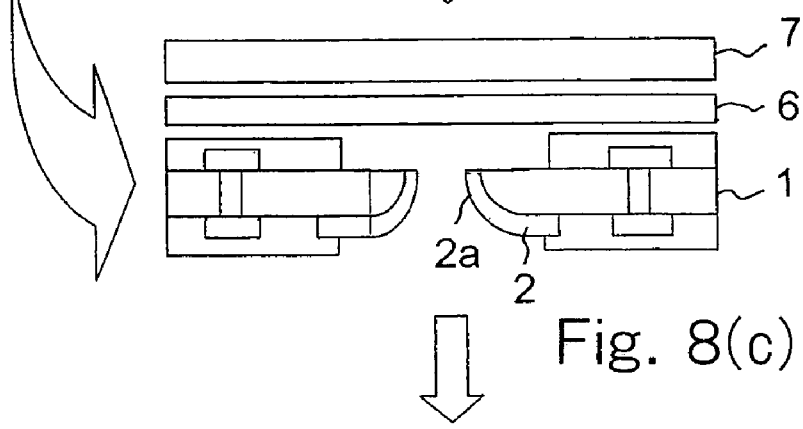
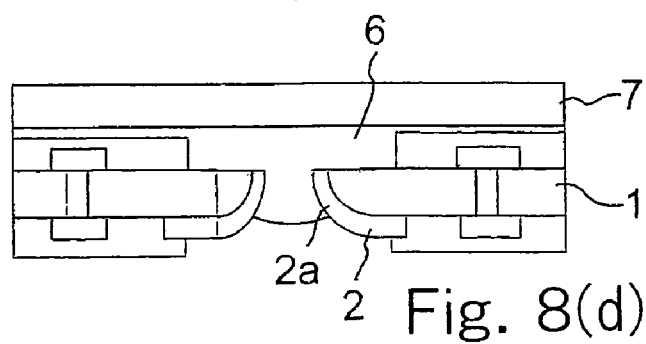
Fig. 8(a)
Fig. 8(b)
Fig. 8(c)
Fig. 8(d)

FLEXIBLE PRINTED CIRCUIT BOARD AND MANUFACTURING METHOD FOR THE SAME

FIELD OF THE INVENTION

The present invention relates to a flexible printed circuit (FPC) board and a manufacturing method for the same, and more particularly, the present invention relates to a single-sided flexible printed circuit (single-sided FPC) board or a double-sided flexible printed circuit (double-sided FPC) board and a manufacturing method of the single-sided FPC or the double-sided FPC, where electronic parts are mounted on one surface or both surfaces of the board, and a metal reinforcing plate is laminated on either surface of the boards via an electrically conductive adhesive to give an electromagnetic shielding function to the board.

DESCRIPTION OF THE RELATED ART

Conventionally, known is FPC in which electronic parts are mounted on one surface or both surfaces of the circuit board, and a metal reinforcing plate is laminated on either surface thereof by an electrically conductive adhesive to give an electromagnetic shielding function thereto (for example, refer to Japanese Patent Laid-Open No. 2005-317946). According to such FPC, since the reinforcing board laminated over the board is a metal plate, an electromagnetic shielding effect is acquired, and a radiating effect of heat generated from electronic parts mounted on the circuit board can also be brought about. An electrical connection between a conductor circuit for grounding (ground circuit) of FPC and the metal reinforcing plate is performed by a method in which an opening hole is provided in a part of a cover lay layer covering over the ground circuit corresponding to a part at which the ground circuit is electrically connected with the metal reinforcing plate, and the metal reinforcing plate and the board are laminated together with a press apparatus via the electrically conductive adhesive, as indicated in Japanese Patent Laid-Open No. 2005-317946, for example. By this, since a part of the electrically conductive adhesive is injected into the opening hole of the cover lay layer to contact with lower part of the ground circuit, the ground circuit and the metal reinforcing plate become to be electrically connected via the electrically conductive adhesive. In the case of using such a connection method, it is preferred to use a sheet shaped electrically conductive adhesive for the ease of handling.

However, in the case that the metal reinforcing plate and the ground circuit is made to be electrically connected, by laminating the metal reinforcing plate and the circuit board together by the press apparatus and making the electrically conductive adhesive to be injected into the opening hole of the cover lay layer, air can remain easily at a top hollow of this opening hole because the upper part of the opening hole of this cover lay layer is blocked by the ground circuit. Therefore, there is a possibility that the electrically conductive adhesive is peeled off on account of expansion of this residual air at the time of a reflow and consequently, the ground circuit and the metal reinforcing plate may become defective continuity electrically. Then, disclosed is a technology such that a through hole which penetrates the ground circuit is provided and the electrically conductive adhesive is made to be injected, with the press apparatus, even up to the ground circuit in the upper part of the circuit board surely through the through hole, when the metal reinforcing plate and the board are laminated via the electrically conductive adhesive (for example, refer to Japanese Patent Laid-Open No. 2005-191076).

According to this technology, since a part of the electrically conductive adhesive applied to the metal reinforcing plate is injected even into the ground circuit through the through hole, the metal reinforcing plate and the ground circuit are electrically connected. However, when there are large amount of filling of the electrically conductive adhesive, there is a possibility of the electrically conductive adhesive flowing even to nearby electronic parts from the ground circuit, and of making the electronic parts short electrically. On the other hand, when there are few amount of filling of the electrically conductive adhesive, the electrical connection between the ground circuit and the metal reinforcing plate may become unstable because the electrically conductive adhesive is not surely injected even up to the ground circuit.

Also, disclosed is a technology such that, when attaching a wiring board to a housing of a metal case, the metal case and the ground circuit of the wiring board are electrically connected each other by fastening, with screws, through holes which has opening both to the ground circuit and the metal case of the wiring board (for example, refer to Japanese Patent Laid-Open No. 5-243756). However, since such a method of grounding the ground circuit is the method of man-hour costing considerably, and is difficult to be applied to microscopic potions, it is difficult to use screws for the connection between FPC and the metal reinforcing plate because circuits of FPC receive constraints. Further, disclosed is a technology which provides a through hole penetrating the ground circuit and makes the through hole to be filled up with an electrically conductive adhesive from both sides (for example, refer to Japanese Patent Laid-Open No. 8-125380). However, in such a method, since the electrically conductive adhesive must be also applied from the side of the circuit board for parts to be mounted, it is difficult to be applied to FPC of the microscopic circuit because the circuit of FPC receives constraints as a result.

Therefore, the technical subject to be solved so that the metal reinforcing plate laminated over one surface of FPC via the electrically conductive adhesive and the ground circuit patternized on the other surface may be made to be surely connected electrically and at the same time, the electrically conductive adhesive may be made not to flow even into electronic parts mounted near the ground circuit comes into being, and an object of the present invention is to solve the subject.

SUMMARY OF THE INVENTION

The present invention is proposed in order to attain the above-mentioned object where, in the invention according to one embodiment, a single-sided flexible printed circuit (FPC) board including an electronic part circuit and a ground circuit formed in one surface of an insulation base, and a metal reinforcing plate laminated on the other surface via an electrically conductive adhesive, comprises:

a hole sagging formed in the ground circuit with the ground circuit and a part of the insulation base punched; and the electrically conductive adhesive injected along with a portion of the hole sagging, wherein the ground circuit and the metal reinforcing plate are electrically connected via the electrically conductive adhesive injected into the portion of the hole sagging According to the single-sided flexible printed circuit board having such a configuration, when applying the electrically conductive adhesive to the insulation base and laminating the metal reinforcing plate thereon and thereafter performing pressing with a press apparatus, a part of the electrically conductive adhesive is injected by the thrust along with the portion of the hole sagging. Therefore, the electrical connection of the ground circuit and the metal reinforcing plate is surely performed by the electrically conductive adhesive injected into the portion of the hole sagging. Thus, conduction reliability of the ground circuit and the metal reinforcing plate can be secured, and at the same time, peeling-proof intensity of the metal reinforcing plate by means of a grommet effect is also secured.

The invention in another embodiment, the hole sagging is formed by a clearance between a diameter of opening of a die and a diameter of a punch when making a through hole in the insulation base and the ground circuit.

According to the single-sided flexible printed circuit board of such a configuration, by providing desired clearance between the diameter of the punch and the diameter of the opening of the die, the hole sagging can be formed in the ground circuit along the inner potion of the through hole, without cutting off the portion of the ground circuit punched by the punch. Therefore, since the electrically conductive adhesive can be made to be injected along with the portion of the hole sagging, the electrical connection of the ground circuit and the metal reinforcing plate can be secured, and at the same time, the peeling-proof intensity of the metal reinforcing plate by means of the grommet effect is also secured.

The invention according to another embodiment, the clearance is 50 to 95% of an overall thickness of the board at a part where the through hole is made.

According to the single-sided flexible printed circuit board of such a configuration, although the dimension of clearance for making the hole sagging generate varies depending on constitution material of the board and the ground circuit which are to be punched by the punch, the suitable hole sagging can be formed in the ground circuit if the clearance of about 50 to 95% of the thickness dimension of the material to be punched is adopted. Therefore, since the electrically conductive adhesive can be made to be injected into the hole sagging portion surely, the electrical connection of the ground circuit and the metal reinforcing plate can be secured sufficiently, and at the same time, the peeling-proof intensity of the metal reinforcing plate by means of the grommet effect is also secured.

In the invention according to another embodiment, a double-sided flexible printed circuit board including an electronic part circuit formed on the both surfaces of an insulation base and a ground circuit formed in one surface of an insulation base, and a metal reinforcing plate laminated on the other surface via an electrically conductive adhesive, comprises:

a hole sagging formed in the ground circuit with the ground circuit and a part of the insulation base punched; and the electrically conductive adhesive injected along with a portion of the hole sagging, wherein the ground circuit and the metal reinforcing plate are electrically connected via the electrically conductive adhesive injected into the portion of the hole sagging.

According to the double-sided flexible printed circuit board of such a configuration, when pressing is performed with a press apparatus after applying the electrically conductive adhesive to the insulation base and laminating the metal reinforcing plate thereon, a part of the electrically conductive adhesive is injected by the thrust along with a portion of the hole sagging. Therefore, the ground circuit and the metal reinforcing plate are electrically surely connected by the electrically conductive adhesive injected into the portion of the hole sagging. By this, the conduction reliability of the ground circuit and the metal reinforcing plate can be secured, and at the same time, peeling-proof intensity of the metal reinforcing plate by means of a grommet effect is also secured.

The invention according to another embodiment, the hole sagging is formed by a clearance between a diameter of an opening of a die and a diameter of a punch when making the through hole in the insulation base and the ground circuit.

According to the double-sided flexible printed circuit board of such a configuration, by providing desired clearance between the diameter of the punch and the diameter of the opening of the die, the hole sagging can be formed in the ground circuit along the inner potion of the through hole, without cutting off the portion of the ground circuit punched by punch. Therefore, since the electrically conductive adhesive can be made to be injected along with the portion of the hole sagging, the electrical connection of the ground circuit and the metal reinforcing plate can be secured, and at the same time, the peeling-proof intensity of the metal reinforcing plate by means of the grommet effect is also secured.

The invention according to another embodiment, the clearance is 50 to 95% of an overall thickness of the board at a part where the through hole is made.

According to the double-sided flexible printed circuit board of such a configuration, although the dimension of clearance for making the hole sagging generate varies depending on constitution material of the board and the ground circuit which are to be punched by punch, the suitable hole sagging can be formed in the ground circuit if clearance of about 50 to 95% of the thickness dimension of the material to be punched is adopted. Therefore, since the electrically conductive adhesive can be made to be injected into the hole sagging portion surely, the electrical connection of the ground circuit and the metal reinforcing plate can be sufficiently secured, and at the same time, the peeling-proof intensity of the metal reinforcing plate by means of the grommet effect is also secured.

The present invention can also provide a manufacturing method of the single-sided or the double-sided flexible printed circuit board. Namely, the invention according to another embodiment is a method for manufacturing a single-sided flexible printed circuit board including an electronic part circuit and a ground circuit formed in one surface of an insulation base, and a metal reinforcing plate laminated on the other surface via an electrically conductive adhesive, comprising the steps of:

a first step for forming a hole sagging in the ground circuit by punching a part of the ground circuit and the insulating base;

a second step for applying the electrically conductive adhesive on the other surface of the board formed by the first step and laminating the metal reinforcing plate thereon; and a third step for pressing and laminating the board and the metal reinforcing plate to the extent that the electrically conductive adhesive is injected into the inner portion of the hole sagging.

According to such a manufacturing method, by applying the electrically conductive adhesive on the insulation base of the single-sided flexible printed circuit board and laminating the metal reinforcing plate thereon and pressing with the press apparatus, a part of electrically conductive adhesive is injected along with the portion of the hole sagging by the thrust. Therefore, the ground circuit and the metal reinforcing plate are electrically surely connected by the electrically conductive adhesive injected into the portion of the hole sagging. The conduction reliability of the ground circuit and the metal reinforcing plate can be secured, and at the same time, the peeling-proof intensity of the metal reinforcing plate by means of a grommet effect is also secured.

The invention according another embodiment is a method for manufacturing a double-sided flexible printed circuit board including an electronic part circuit formed on both surfaces of an insulation base and a ground circuit formed in one surface of an insulation base, and a metal reinforcing plate laminated on the other surface via an electrically conductive adhesive, comprising the steps of:

a first step for forming a hole sagging in the ground circuit by punching a part of the ground circuit and the insulating base;

a second step for applying the electrically conductive adhesive on the other surface of the board formed by the first step and laminating the metal reinforcing plate thereon; and a third step for pressing and laminating the board and the metal reinforcing plate to the extent that the electrically conductive adhesive is injected into the inner portion of the hole sagging.

According to such a manufacturing method, by applying the electrically conductive adhesive on the insulation base of the double-sided flexible printed circuit board and laminating the metal reinforcing plate thereon and pressing with the press apparatus, a part of electrically conductive adhesive is injected along with the portion of the hole sagging by the thrust. Therefore, the ground circuit and the metal reinforcing plate are electrically surely connected by the electrically conductive adhesive injected into the portion of the hole sagging. The conduction reliability of the ground circuit and the metal reinforcing plate can be secured, and at the same time, the peeling-proof intensity of the metal reinforcing plate by means of a grommet effect is also secured.

EFFECT OF THE INVENTION

According to another embodiment of the present invention, in the single-sided flexible printed circuit board, the ground circuit and the metal reinforcing plate are electrically surely connected by the electrically conductive adhesive injected into the portion of the hole sagging of the ground circuit. By this, the conduction reliability of the ground circuit and the metal reinforcing plate can be secured, and at the same time, the peeling-proof intensity of the metal reinforcing plate by means of the grommet effect is also secured.

According to another embodiment of the present invention in the single-sided flexible printed circuit board, the hole sagging can be formed in the ground circuit along the inner potion of the through hole by providing a clearance in the part of the ground circuit punched by the punch. Since the electrically conductive adhesive can be made to inject along with the portion of the hole sagging by this, the electrical connection of the ground circuit and the metal reinforcing plate is secured.

According to another embodiment of the present invention, in the single-sided flexible printed circuit board, if the clearance of about 50 to 95% of the thickness of the material to be punched is adopted, the suitable hole sagging can be formed in the ground circuit. Therefore, since the electrically conductive adhesive can be made to be injected into the portion of the hole sagging surely, the electrical connection of the ground circuit and the metal reinforcing plate can be fully secured, and at the same time, the peeling-proof intensity of the metal reinforcing plate by means of the grommet effect is also secured.

According to another embodiment of the present invention, in the double-sided flexible printed circuit board, the ground circuit and the metal reinforcing plate are electrically surely connected by the electrically conductive adhesive injected into the portion of the hole sagging of the ground circuit. By this, the conduction reliability of the ground circuit and the metal reinforcing plate can be secured, and at the same time, the peeling-proof intensity of the metal reinforcing plate by means of the grommet effect is also secured.

According to another embodiment of the present invention, in the double-sided flexible printed circuit board, the hole sagging can be formed in the ground circuit along the inner potion of the through hole by providing a clearance in the part of the ground circuit to be punched by the punch. By this, since the electrically conductive adhesive can be made to be injected along with the portion of the hole sagging, the electrical connection of the ground circuit and the metal reinforcing plate can be secured, and at the same time, the peeling-proof intensity of the metal reinforcing plate by means of the grommet effect is also secured.

According to another embodiment of the present invention, in the double-sided flexible printed circuit board, if the clearance of about 50 to 95% of the thickness of the material to be punched is adopted, the suitable hole sagging for the ground circuit can be formed. Therefore, since the electrically conductive adhesive can be made to be injected into the portion of the hole sagging surely, the electrical connection of the ground circuit and the metal reinforcing plate is fully secured.

According to another embodiment of the present invention, in the single-sided flexible printed circuit board, by press pressing the ground circuit and the metal reinforcing plate, the electrical connection therebetween is surely attained by the electrically conductive adhesive injected into the portion of the hole sagging. By this, the conduction reliability of the ground circuit and the metal reinforcing plate can be secured, and at the same time, the peeling-proof intensity of the metal reinforcing plate by means of the grommet effect is also secured.

According to another embodiment of the present invention, in the double-sided flexible printed circuit board, by press pressing the ground circuit and the metal reinforcing plate, the electrical connection therebetween is surely attained by the electrically conductive adhesive injected into the portion of the hole sagging. By this, the conduction reliability of the ground circuit and the metal reinforcing plate can be secured, and at the same time, the peeling-proof intensity of the metal reinforcing plate by means of the grommet effect is also secured.

BRIEF DESCRIPTION OF THE DRAWINGS

FIG. 8(a)-FIG. 8(d) show a flow sheet of a process of laminating the insulation base and the metal reinforcing plate of double-sided FPC in a second embodiment of the present invention.

DETAILED DESCRIPTION OF THE PREFERRED EMBODIMENTS

In order to realize the object of performing surely an electrical connection of a metal reinforcing plate laminated over one surface of FPC via a electrically conductive adhesive and a ground circuit patternized on the other surface, and preventing the electrically conductive adhesive from flowing even into electronic parts mounted near the ground circuit, the present invention has been realized by providing a single-sided flexible printed circuit board comprising: a electronic part circuit and the ground circuit formed on one surface of an insulation base; the metal reinforcing plate laminated on the other surface thereof via the electrically conductive adhesive; a hole sagging formed in the ground circuit by punching a part of the ground circuit and the insulating base together; and the electrically conductive adhesive injected along with the portion of the hole sagging, wherein the ground circuit and the metal reinforcing plate are electrically connected with each other via the electrically conductive adhesive injected into the portion of the hole sagging.

Hereafter, in order to facilitate an understanding, FIGS. 1 to 8 are used, and a preferred embodiment according to the present invention is described in detail, contrasting with a conventional art.

Figure 1A:
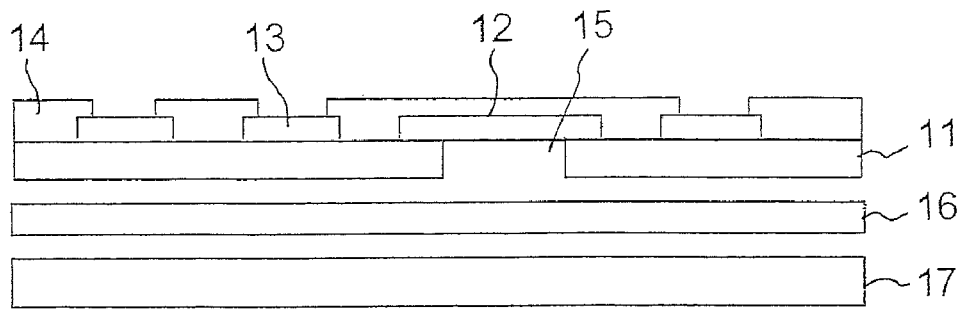
FIG. 1(a)-FIG. 1(b) show a flow sheet of a common process of laminating a metal reinforcing plate and a insulation base in the case of making a non-through hole in a single-sided FPC.

First, an electrical connection method of a ground circuit of FPC and a metal reinforcing plate in a conventional art is described. FIG. 1 is a flow sheet of a common lamination process of the metal reinforcing plate and the insulation base in the case of opening a non-through hole on single-sided FPC. As shown in FIG. 1A, ground circuit 12 and electronic part circuit 13 are wired (patternized) on one surface of insulation base 11 in single-sided FPC, and cover lay layer 14 is provided thereon with an insulation film coated on ground circuit 12 and on the part except the part mounting position of electronic part circuit 13. And non-through hole 15 which does not penetrate up to ground circuit 12 is provided in insulation base (insulating substrate) 11 located in the lower side of ground circuit 12. Further, electrically conductive adhesive 16 is applied to the lower side of insulation base 11, and metal reinforcing plate 17 is disposed at the lower part thereof.

Figure 1B:
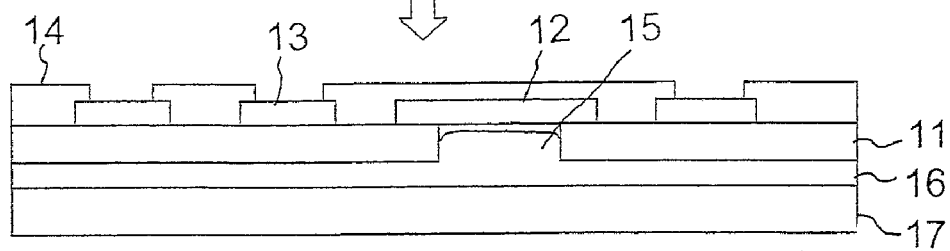

As shown in FIG. 1B, when insulation base 11 and metal reinforcing plate 17 are pressed and laminated via electrically conductive adhesive 16 with a press apparatus not illustrated, a part of electrically conductive adhesives 16 is injected even into the inner potion of non-through hole 15. In actual press pressing, insulation base 11, electrically conductive adhesive 16, and metal reinforcing plate 17, are laminated in this order from the bottom contrary to the direction in FIG. 1 and press pressing is performed.

When press pressing is performed like this, as FIG. 1B is viewed up-and-down reverse, air remains at the lowermost part of non-through hole 15, and electrically conductive adhesive 16 can not be injected up to the lowermost part of ground circuit 12. Therefore, there is a possibility that the defect that ground circuit 12 and metal reinforcing plate 17 are not electrically connected each other may arise. When a reflow is performed in the state of lamination as shown in FIG. 1B, there is also a possibility that metal reinforcing plate 17 may separate and fall from electrically conductive adhesive 16 because the residual air expands.

That is, in single-sided FPC as shown in FIG. 1, it is necessary to form non-through hole 15 in the insulation base 11 side so that the electrical connection of ground circuit 12 and metal reinforcing plate 17 can be realized via electrically conductive adhesive 16. At this time, in the case of punching a part of insulation base 11 by a laser beam etc. so that non-through hole 15 may be made to reach to the lower part of ground circuit 12, since the working man hour is needed considerably, and moreover, the opening potion is non-through hole 15, a residual air will become to exist. In order to solve the problem, if the lamination as shown in FIG. 1B is performed under a vacuum atmosphere, the problem of the residual air will be solved, but since vacuum suction takes time, the workability of the substrate fabrication worsens and the productivity results in being inferior.

Figure 2B:
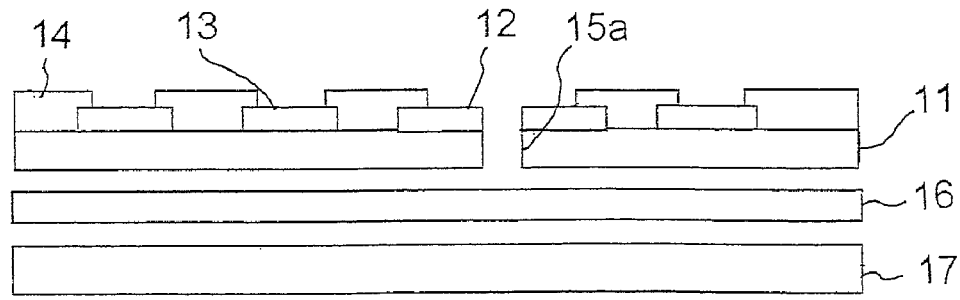
FIG. 2(a)-FIG. 2(b) show a flow sheet of a common process of laminating the metal reinforcing plate and the insulation base in the case of making a through hole in the single-sided FPC.
Figure 2A:
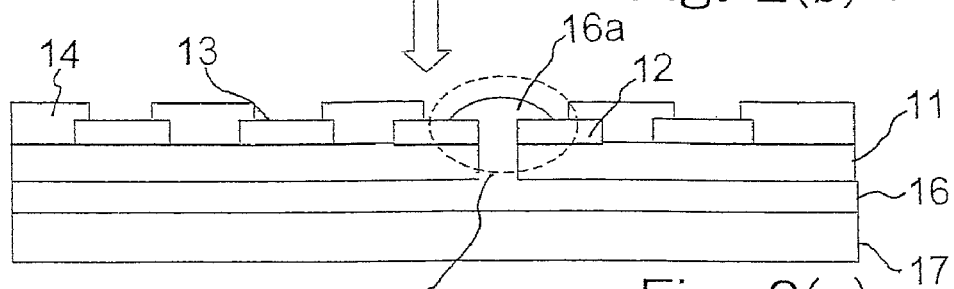

FIG. 2 is a flow sheet of a common lamination process of the metal reinforcing plate and the insulation base in the case of making a through hole on single-sided FPC. The point where the configuration of FIG. 2A differs from FIG. 1A, is only the point that through hole 15a is open from insulation base 11 up to the upper part of ground circuit 12.

As shown in FIG. 2B, when insulation base 11 and metal reinforcing plate 17 are laminated together via electrically conductive adhesive 16 by the press apparatus which is not illustrated, like the case of FIG. 1B, a part of electrically conductive adhesives 16 is injected even up to the upper part of ground circuit 12 through the inner potion of through hole 15a. In actual press pressing, insulation base 11, electrically conductive adhesive 16, and metal reinforcing plate 17, are laminated in this order from the bottom contrary to the direction in FIG. 1 and then press pressing is performed thereto.

When such the lamination is performed, as shown in FIG. 2B, electrically conductive adhesive 16 fills up the inner potion of through hole 15a, and this electrically conductive adhesive 16 swells on the upper surface of ground circuit 12 to become grommet 16a (refer to section a), and the mechanical strength of the junction of insulation base 11 and metal reinforcing plate 17 increases thereby, and metal reinforcing plate 17 becomes difficult to separate. Further, since air does not remain owing to through hole 15a, a possibility that insulation base 11 and metal reinforcing plate 17 may separate at the time of the reflow also disappears.

Namely, as shown in FIG. 2A, in a method for forming through hole 15a with perforating insulation base 11 and ground circuit 12 by a not-shown perforation punch etc. and connecting ground circuit 12 and metal reinforcing plate 17 each other by making electrically conductive adhesive 16 get into in this through hole 15a, since electrically conductive adhesive 16 fills up in through hole 15a, the electrically conductive adhesive 16 reaches to the upper part of through hole 15a to become grommet 16a (refer to the section a of FIG. 2B), and metal reinforcing plate 17 becomes difficult to separate because the mechanical strength increases more. Further, since air does not remain owing to through hole 15a, a possibility of the stress being generated at the time of the reflow also disappears.

That is, in the case that a suitable quantity of electrically conductive adhesive 16 is injected into through hole 15a, the effect of grommet 16a as shown in FIG. 2B can be obtained.

However, in the case that large amount of electrically conductive adhesives 16 are injected into through hole 15a, electrically conductive adhesive 16 may flow out from ground circuit 12. In the case that a small amount of electrically conductive adhesives 16 are injected into through hole 15a, electrically conductive adhesive 16 may not fully spread in ground circuit 12.

Figure 3:
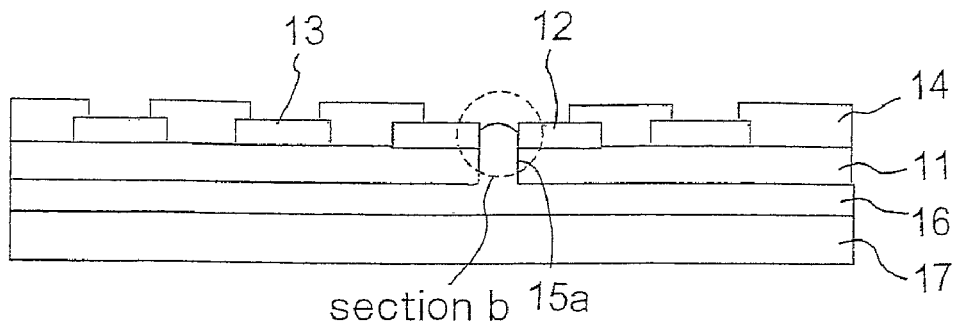
FIG. 3 shows a cross sectional view of FPC when there is a little filling of an electrically conductive adhesive in the through hole in the lamination process of FIG. 2.

FIG. 3 is a cross sectional view of FPC when there are a little amount of filling of electrically conductive adhesive 16 in the through hole in the lamination process of FIG. 2. As shown in FIG. 3, when there is a little amount of filling of electrically conductive adhesive 16 injected into through hole 15a, electrically conductive adhesive 16 will only contact the through-hole wall surface of ground circuit 12 as shown in the section b, and metal reinforcing plate 17 separates easily from insulation base 11 because the grommet effect owing to electrically conductive adhesive 16 cannot be provided. In the case that there are a little amount of filling of electrically conductive adhesive 16 in through hole 15a, a contact area of electrically conductive adhesive 16 and ground circuit 12 will be restricted, and it becomes difficult to fully secure the conduction reliability of ground circuit 12 and metal reinforcing plate 17.

Figure 4:
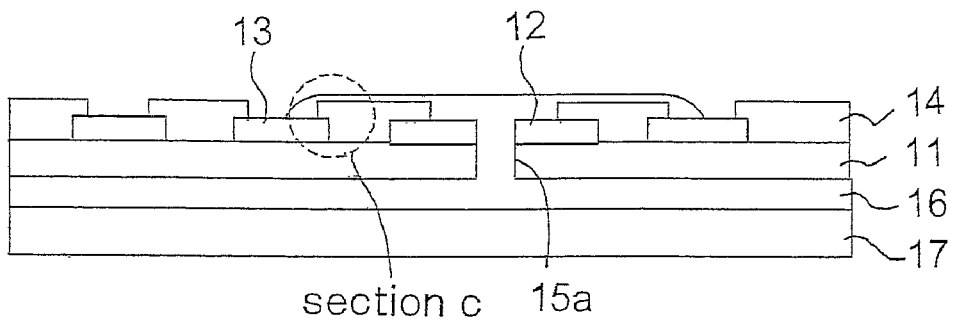
FIG. 4 shows a cross sectional view of FPC when there is too much filling of the electrically conductive adhesive in the through hole in the lamination process of FIG. 2.

FIG. 4 is a cross sectional view of FPC when there are too much amount of filling of electrically conductive adhesive 16 in the through hole in the lamination process of FIG. 2. As shown in FIG. 4, when there are too much amount of filling of electrically conductive adhesive 16 injected into through hole 15a, as shown in the section c, electrically conductive adhesive 16 flows out from the surface of ground circuit 12 up to the surface of electronic part circuit 13 nearby on which electronic parts are mounted and the electronic part circuit 13 will be short-circuited electrically. That is, when large amount of electrically conductive adhesives 16 is made to be filled up in through hole 15a, electrically conductive adhesive 16 overflows over the portion of electronic part circuit 13 on which electronic parts are mounted, and if there are terminals for part-mounting in the vicinity thereof, there will be the possibility of shorting the terminals and consequently damaging electronic parts.

In any following cases that there are a proper amount of filling of electrically conductive adhesive 16 as shown in FIG. 2B, that there are too little amount of filling of electrically conductive adhesive 16 as shown in FIG. 3, and that there are too much amount of filling of electrically conductive adhesive 16 as shown in FIG. 4, it is possible to avoid a state as shown in FIG. 3 or FIG. 4 to some extent by controlling the fluidity of electrically conductive adhesive 16 with heating temperature, and controlling pressing pressure. However, the working condition range for the pressing becomes what is restricted fairly, and the workability of FPC gets extremely bad.

Figure 5:
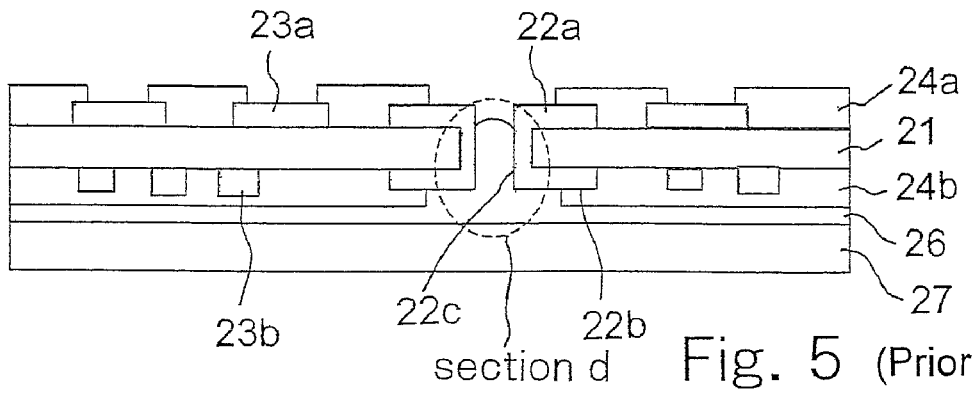
FIG. 5 shows a cross sectional view of a common process of laminating a metal reinforcing plate and a insulation base in the case of making a through hole in a double-sided FPC.

FIG. 5 is across sectional view of a common lamination process of the metal reinforcing plate and the insulation base in the case of making a through hole in double-sided FPC. As shown in FIG. 5, in the case that double-sided FPC, ground circuits 22a and 22b and electronic part circuits 23a and 23b are formed in both sides of insulation base 21, an insulation film is applied to each surface to form cover lay layers 24a and 24b thereon. On the undersurface side of insulation base 21, metal reinforcing plate 27 is laminated via electrically conductive adhesive 26 by press pressing.

That is, as shown in FIG. 5, in the case that double-sided FPC, if through hole plating 22c is performed between ground circuit 22a and ground circuit 22b on both sides of insulating base 21, there will be no possibility that air may enter the interior hole of through hole plating 22c at the time of laminating insulation base 21 and metal reinforcing plate 27. In other words, as shown in section d of FIG. 5, at the time of laminating insulation base 21 and metal reinforcing plate 27, since air is emitted outside through the interior hole of through hole plating 22C and electrically conductive adhesive 26 is injected even into the interior hole of through hole plating 22C, the electrical connection of ground circuits 22a and 22b and metal reinforcing plate 27 is performed surely. However, in the case that a suitable quantity of electrically conductive adhesive 26 is not injected into through hole 22C, the effect of grommet 16a as shown in FIG. 2B cannot be obtained, and the mechanical strength becomes insufficient, and metal reinforcing plate 27 separates easily. When there are too much amount of filling of electrically conductive adhesive 16 injected into through hole 22c, as shown in FIG. 4, since there is the problem that electrically conductive adhesive 16 flows out from the surface of ground circuit 12 up to the surface of electronic part circuit 13 on which electronic parts are mounted, there is no change in that the working condition range for the pressing becomes what is restricted fairly.

Figure 6:
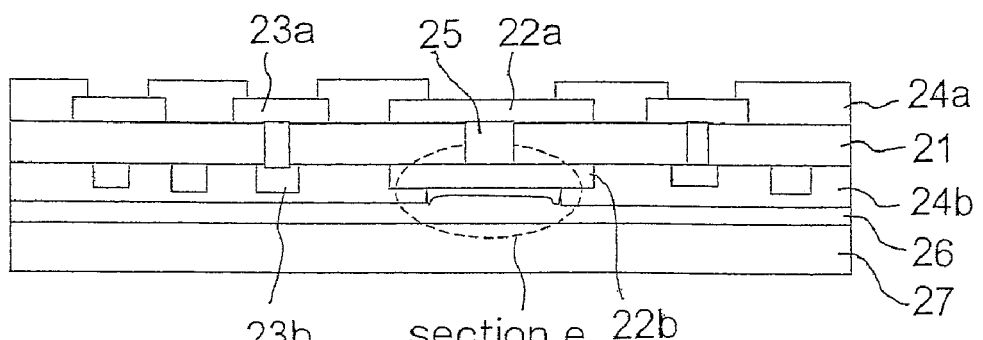
FIG. 6 shows a cross sectional view of a common process of laminating the metal reinforcing plate and the insulation base in the case that a non-through hole exists in the double-sided FPC.

FIG. 6 is a cross sectional view of a common lamination process of the metal reinforcing plate and the insulation base in the case that the circuit board in which an interlayer connection of both sides of double-sided FPC is performed by filling up the through hole with conductive material. Namely, as shown in FIG. 6, in the case that the interlayer connection between ground circuit 22a and ground circuit 22b is performed after filling up through-hole 25 of insulation base 21 with conductive material, the opening of the lower part of insulation base 21 will be in a state of a non-through hole as shown in the section e of FIG. 6. Therefore, when press pressing of insulation base 21 and the metal reinforcing plate 27 is performed via electrically conductive adhesive 26, air has remained in the portion of the non-through hole of the lower part of ground circuit 22b, and the electrical connection of ground circuits 22a and 22b and metal reinforcing plate 27 will be in an unstable state.

The present invention has realized FPC where the electrical connection of the ground circuit and the metal reinforcing plate is performed surely without the residual air at the opening of insulation base 21 in any of single-sided FPC and double-sided FPC and a method for manufacturing the FPC. This enables it to secure the conduction reliability between the ground circuit and the metal reinforcing plate, and at the same time, the peeling-proof intensity of the metal reinforcing plate by means of the grommet effect is also secured.

FIG. 7 is a flow sheet of a lamination process of the insulation base of single-sided FPC and the metal reinforcing plate in a first embodiment according to the present invention. As shown in FIG. 7A, ground circuit 2 is patternized on one surface of insulation base 1, and an insulation film is coated on the necessary part of the ground circuit 2 to form cover layer 3. The other surface of insulation base 1 is placed on die 4. Opening 4a for cylindrical punch 5 to penetrate therein with desired clearance is provided in this die 4. Here, although a clearance between a diameter of punch 5 and a diameter of opening 4a of die 4 is usually 3 to 5 micrometers, the clearance may be extended up to about 50 to 95% of the thickness of insulation base 1. In FIG. 7, only an important section concerning the embodiment is shown, and electronic part circuits, etc. formed in one surface of insulation base 1 are omitted.

Figure 7A:
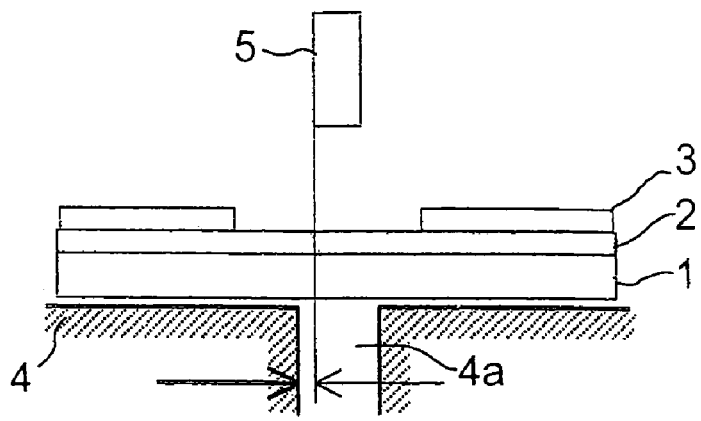
FIG. 7(a)-FIG. 7(d) show a flow sheet of a process of laminating the insulation base and the metal reinforcing plate of single-sided FPC in a first embodiment of the present invention.

Next, the other surface of insulation base 1 is placed on die 4 so that the portion of ground circuit 2 where cover lay layer 3 is not formed may be located in opening 4a of die 4, and punching ground circuit 2 and insulation base 1 is performed by punch 5. And then, hole sagging 2a is formed in ground circuit 2 as shown in the section a of FIG. 7B As shown in FIG. 7C, up-and-down inversion of the punched insulation base 1 is carried out, electrically conductive adhesive 6 is applied on the one surface (upper surface) of insulation base 1, and metal reinforcing plate 7 is laid thereon.

Figure 7B:
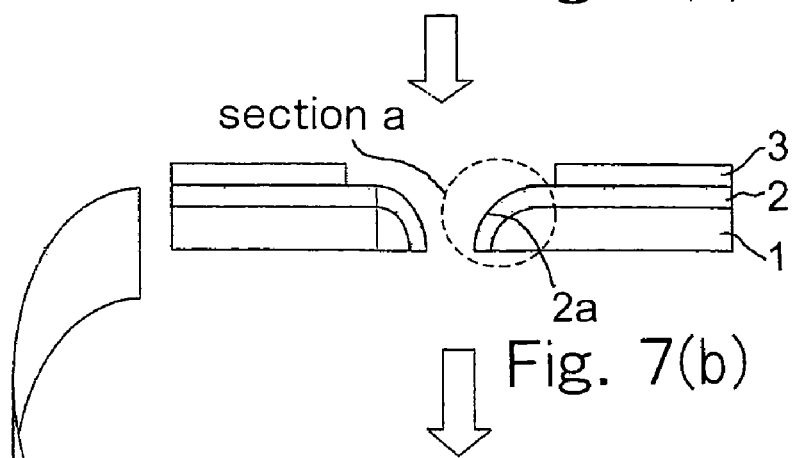
Figure 7C:
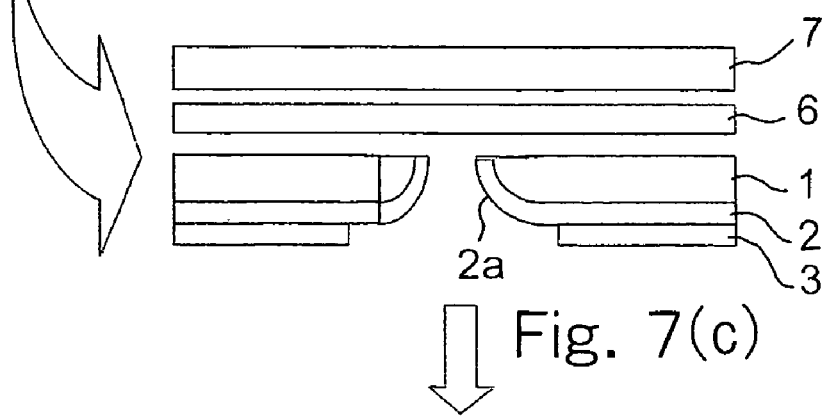
Figure 7D:
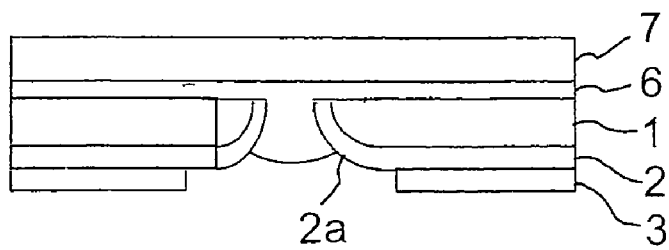

Next, when metal reinforcing plate 7 and the insulation base 1 is pressed to be laminated with the press apparatus which is not illustrated, electrically conductive adhesive 6 is injected into the inner potion of hole sagging 2a of ground circuit 2 as shown in FIG. 7D. By this, since electrically conductive adhesive 6 fully spreads into hole sagging 2a of ground circuit 2, without the residual air in the portion into which electrically conductive adhesive 6 is injected, ground circuit 2 and metal reinforcing plate 7 are electrically surely connected via electrically conductive adhesive 6.

That is, a punch hole is formed in an opening (a part of ground circuit 2 which is not covered by cover lay layer 3) of the cover lay layer of the connection portion where metal reinforcing plate 7 and ground circuit 2 are connected as shown in FIG. 7B. At this time, the punch hole is made to take the large clearance between punch 5 and opening 4a of die 4, and is made to form hole sagging 2a in the outflow side of electrically conductive adhesive 6. As shown in FIG. 7C, up-and-down inversion of the insulation base 1 is performed, and metal reinforcing plate 7 is laminated thereon via electrically conductive adhesive 6 from the insulation base 1 side.

A wall surface of hole sagging 2a in the through hole comes to form a part of ground circuit 2 by making ground circuit 2 approach the electrically conductive adhesive 6 side by hole sagging 2a. Therefore, since the conduction reliability of ground circuit 2 and metal reinforcing plate 7 is fully secured even if the through hole is not filled up with large amount of electrically conductive adhesives 6, sufficient conduction reliability can be acquired and at the same time the grommet effect can also be secured even if a thin electrically conductive adhesive seat is used, and the yield rate also improves because it is not necessary to manage strict pressing conditions.

Thus, as shown in FIGS. 7A and 7B, the insulation base 1 side of single-sided FPC is turned down (die 4 side), the part-mounting surface side is turned up and the portion of ground circuit 2 which will be electrically connected to metal reinforcing plate 7, is punched by cylindrical punch 5 of which the clearance dimension is 50 to 95% of the thickness of the material to be punched. As shown in FIG. 7C, the insulation base 1 side is turned up, and electrically conductive adhesive 6 and metal reinforcing plate 7 are laminated in this order, and metal reinforcing plate 7 is laminated thereon by pressing with heating by the press apparatus which is not illustrated. Laminated FPC as shown in FIG. 7D is formed by this. By taking such a manufacturing process, the electrical connection of metal reinforcing plate 7 and ground circuit 2 can be attained by the interlaminar conduction by means of electrically conductive adhesive 6, and the residual air is avoided.

In the case of FPC where the overall thickness of insulation base 1 is less than 0.1 mm, if hole manufacturing is performed so that a hole sagging may not be made to be generated, the clearance between the diameter of punch 5 and opening 4a of die 4 may be about 3 to 5 micrometers mostly However, in order that hole sagging 2a is made to be generated to the side of electrically conductive adhesive 6, the clearance dimension is preferred to be 50 to 95% of the thickness of the material to be punched out, although the clearance varies depending on the material of the object (namely, ground circuit 2 and insulating pace 1) to be punched out.

For example, in the case that the thickness of insulation base 1 is 25 micrometers and the thickness of the circuit metallic foil of ground circuit 2 is 18 micrometers, the clearance of 40 micrometers (that is, 93% of the overall thickness) is recommended. It is not desirable to adopt the large clearance rather than that because a crack may arise in the circuit metallic foil of ground circuit 2.

In the case that ground circuit 2 is covered with hard materials, such as nickel plating, a desired hole sagging can be generated even without so large clearance. For example, in the case that the thickness of insulation base 1 is 25 micrometers, the thickness of the circuit metallic foil of ground circuit 2 is 18 micrometers, and the thickness of the nickel plating layer is 6 micrometers, the clearance of 25 micrometers (that is, 51% of the overall thickness) is recommended.

The present invention is applicable not only in single-sided FPC but also double-sided FPC. Namely, as the double-sided FPC shown in above-mentioned FIG. 5, in the case that interlaminar conduction is carried out by a through hole, air will be removed via the through hole. However, in the case that an interlayer connection is carried out by filling up through hole 25 with conductive material as shown in FIG. 6, since an interlaminar conduction portion becomes a non-through hole, the residual air will exist. Therefore, in order to solve such a problem in double-sided FPC, a method for laminating the insulation base and the metal reinforcing plate in a second embodiment according to the present invention is applied.

FIG. 8 is a flow sheet of a lamination process of an insulation base of both-sided FPC and a metal reinforcing plate in a second embodiment of the present invention. As shown in FIG. 8A, as for a double-sided FPC, electronic part circuits 8a and 8b are formed on both sides of insulation base 1a, and interlayer connection is carried out between electronic part circuit 8a and electronic part circuit 8b with a through hole filled up with conductive resin 9. In one surface (upper surface) of insulation base 1a, ground circuit 2 is formed. Cover lay layers 3a and 3b are formed on whole surfaces of electronic part circuit 8a and 8b, and a part of ground circuit 2. Double-sided FPC formed in this way is mounted on die 4.

And when punch 5 punches the portion of ground circuit 2 where cover lay layers 3a and 3b are not formed, as shown in the section b of FIG. 7B, hole sagging 2a will be formed in ground circuit 2.

As shown in FIG. 8C, up-and-down inversion of the insulation base 1a is performed, and metal reinforcing plate 7 is laminated via electrically conductive adhesive 6 from the insulation base 1a side. Next, when metal reinforcing plate 7 and insulation base 1 is pressed and laminated with the press apparatus which is not illustrated, double-sided FPC as shown in FIG. 8D will be formed. At this time, since the filling up of electrically conductive adhesive 6 via hole sagging 2a of ground circuit 2 is performed, the electrical connection between ground circuit 2 and metal reinforcing plate 7 is surely secured via electrically conductive adhesive 6 and at the same time, the peeling-proof intensity of the metal reinforcing plate by means of the grommet effect can be also secured.

As a matter of course, the present invention can be changed variously, unless it departs from the spirit of the present invention, and it is natural that the present invention will cover the variations.

DESCRIPTION OF REFERENCE NUMERALS 1, 1a, and 11 and 21 INSULATION BASE
2, 12, 22a, and 22b GROUND CIRCUIT
22C THROUGH HOLE PLATING 2a HOLE SAGGING
3, 3a, 3b, 14, 24a, and 24b COVER LAY LAYER
4 DIE
4a OPENING
5 PUNCH
6, 16, and 26 ELECTRICALLY CONDUCTIVE ADHESIVE
7, 17, and 27 METAL REINFORCING PLATE
8a, 8b, 13, 23a, and 23b ELECTRONIC PART CIRCUIT
9 CONDUCTIVE RESINE
15 NON-THROUGH HOLE
15a and 25 THROUGH HOLE

What is claimed is:

1. A single-sided flexible printed circuit (FPC) board including an electronic part circuit and a ground circuit formed in one surface of an insulation base, and a metal reinforcing plate laminated on the other surface via an electrically conductive adhesive, comprising:
   a hole sagging formed in the ground circuit with a part of the ground circuit and the insulation base punched together; and
   the electrically conductive adhesive injected along with a portion of the hole sagging, wherein
   the ground circuit and the metal reinforcing plate are electrically connected via the electrically conductive adhesive injected into the portion of the hole sagging.

2. The single-sided flexible printed circuit board according to claim 1, wherein the hole sagging is formed by a clearance between a diameter of an opening of a die and a diameter of a punch when making a through hole in the insulation base and the ground circuit.

3. The single-sided flexible printed circuit board according to claim 2, wherein
   the clearance is 50 to 95% of an overall thickness of the board at a part where the through hole is made.

4. A double-sided flexible printed circuit board including an electronic part circuit formed on both surfaces of an insulation base and a ground circuit formed in one surface of the insulation base, and a metal reinforcing plate laminated on the other surface via an electrically conductive adhesive, comprising:
   a hole sagging formed in the ground circuit with a part of the ground circuit and the insulation base punched together; and
   the electrically conductive adhesive injected along with a portion of the hole sagging, wherein
   the ground circuit and the metal reinforcing plate are electrically connected via the electrically conductive adhesive injected into the portion of the hole sagging.

5. The double-sided flexible printed circuit board according to claim 4, wherein
   the hole sagging is formed by a clearance between a diameter of an opening of a die and a diameter of a punch when making a through hole in the insulation base and the ground circuit.

6. The double-sided flexible printed circuit board according to claim 5, wherein
   the clearance is 50 to 95% of an overall thickness of the board at a part where the through hole is made.

7. A method for manufacturing a single-sided flexible printed circuit board including an electronic part circuit and a ground circuit formed in one surface of an insulation base, and a metal reinforcing plate laminated on the other surface via an electrically conductive adhesive, comprising the steps of:
   a first step for forming a hole sagging in the ground circuit by punching a part of the ground circuit and the insulating base;
   a second step for applying the electrically conductive adhesive on the other surface of the board formed by the first step and for laminating the metal reinforcing plate thereon; and
   a third step for pressing and laminating the board and the metal reinforcing plate to the extent that the electrically conductive adhesive is injected into the inner portion of the hole sagging.

8. A method for manufacturing a double-sided flexible printed circuit board including an electronic part circuit formed on both surfaces of an insulation base and a ground circuit formed in one surface of the insulation base, and a metal reinforcing plate laminated on the other surface via an electrically conductive adhesive, comprising the steps of:
   a first step for forming a hole sagging in the ground circuit by punching a part of the ground circuit and the insulating base;
   a second step for applying the electrically conductive adhesive on the other surface of the board formed by the first step and for laminating the metal reinforcing plate thereon; and
   a third step for pressing and laminating the board and the metal reinforcing plate to the extent that the electrically conductive adhesive is injected into the inner portion of the hole sagging.

* * * * *